United States Patent [19]

Ginetti

[11] Patent Number: 5,594,445
[45] Date of Patent: Jan. 14, 1997

[54] PIPELINED ANALOG TO DIGITAL CONVERTERS AND INTERSTAGE AMPLIFIERS FOR SUCH CONVERTERS

[75] Inventor: Bernard Ginetti, Antibes, France

[73] Assignee: VLSI Technology, Inc., San Jose, Calif.

[21] Appl. No.: 448,597

[22] PCT Filed: Nov. 2, 1993

[86] PCT No.: PCT/EP93/03051

§ 371 Date: Jul. 20, 1995

§ 102(e) Date: Jul. 20, 1995

[87] PCT Pub. No.: WO94/11951

PCT Pub. Date: May 26, 1994

[30] Foreign Application Priority Data

Nov. 19, 1992 [GB] United Kingdom ............. 9224238

[51] Int. Cl.⁶ .................................................. H03M 1/42
[52] U.S. Cl. ................................................... 341/162
[58] Field of Search .................................. 341/162, 165, 341/155, 159

[56] References Cited

U.S. PATENT DOCUMENTS 5,047,772  9/1991  Ribner ................................. 341/156

Primary Examiner—Brian K. Young
Attorney, Agent, or Firm—Burns, Doane, Swecker & Mathis, LLP

[57] ABSTRACT

An interstage amplifier for a pipelined analog to digital converter comprises an operational amplifier (50) having a first pair of capacitors (55,58), a second pair of capacitors (56,57), and switching means (59-62) connected to the capacitors and amplifier. The switching means interchanges the capacitor connections to compensate for offset in the amplifier. The arrangement provides first-order correction of capacitor mismatch.

8 Claims, 4 Drawing Sheets

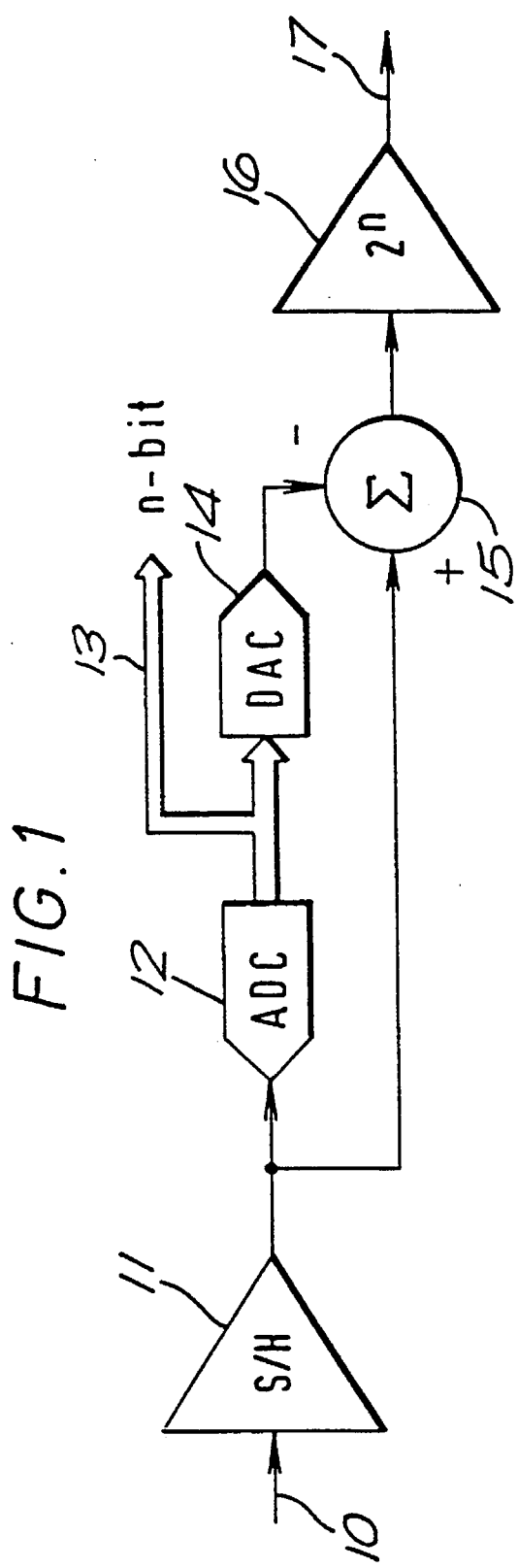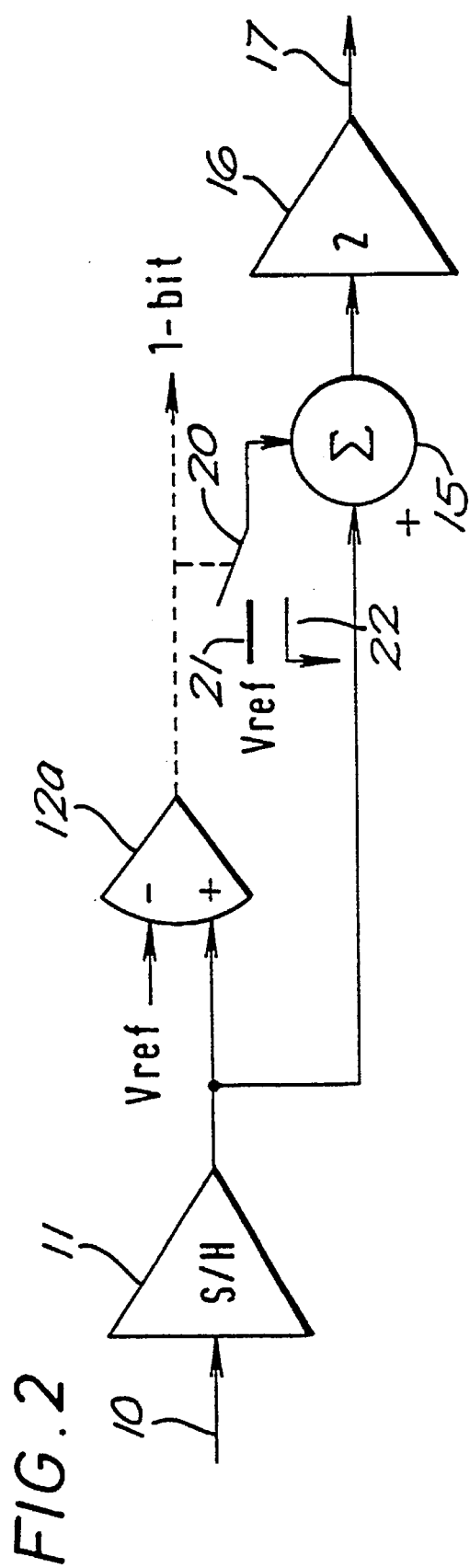
FIG.1
FIG.2

CLOCK PHASE 1:

CLOCK PHASE 2:

CLOCK PHASE 3:

CLOCK PHASE 4:

FIG.6

PIPELINED ANALOG TO DIGITAL CONVERTERS AND INTERSTAGE AMPLIFIERS FOR SUCH CONVERTERS

BACKGROUND

The present invention relates to the conversion of analog signals to digital signals and particularly to a pipelined analog-to-digital converter. It relates also to an interstage amplifier for use in such a converter.

Much attention has been devoted in the art to the design of an analog-to-digital converter which can produce conversion at high sampling rates, with a minimum of delay through the converter, with reasonable accuracy and with low cost and/or minimum occupation of area if the converter is to be incorporated as an integrated circuit or part thereof. The most rapid known form of conversion is byway of a 'flash' converter, in which the input analog signal is applied to a multiplicity of comparators arranged to provide a digital output in minimum time, i.e. one clock cycle. However, the number of comparators required in a flash converter increases exponentially with the accuracy required, with attendant increases in cost and area occupied by the converter. It is also known to provide a two stage or sub-ranging converters. However, even these converters suffer from excessive growth of the area, power consumption and input capacitance with the number of bits resolved and there are difficulties inherent in cancelling offsets and mismatches. Although both flash and subranging converters are adequate for some applications, they are generally unsatisfactory for applications that require a resolution greater than ten bits.

A form of converter which shows at least theoretically more benefits in terms of area, power consumption, input capacitance and cost is a pipelined analog to digital converter. In a typical form of such a converter, there is at each stage a resolution of only a small number of bits (typically only one bit) and a residue obtained by comparing a reference signal with a multiplied version of the input analog signal is passed to the next stage of the converter. In a simple version, although there are more complex versions to which reference will be made later, an input signal may be multiplied by two and compared with a reference signal. If the multiplied input signal to the stage is greater than the reference signal, the bit output for that stage is unity (1) whereas if it is less than the reference signal the bit output for that stage is zero (0). A residue may be formed by, depending on the comparison, either the multiplied signal itself or the difference between the multiplied signal and the reference signal. This residue is again multiplied by two and compared with the reference signal to provide the next least significant bit and so on.

A pipelined analog-to-digital converter of this general type requires an interstage amplifier which preferably is based on an operational (i.e. very high gain) amplifier which employs switched capacitors. Such an amplifier and, for example, a single comparator and associated FET transistor switches constitute the comparatively small number of components needed for each stage of the converter. Accordingly, a pipelined converter is at least theoretically more convenient for high resolution applications than flash converters or subranging converters.

However, pipelined converters suffer from several imperfections such as offset, gain error and a variety of non linearities which require to be eliminated or at least compensated before the converter is appropriate for use at high sampling rates and with high resolution.

SUMMARY OF THE STATE OF THE ART

Various digital correction techniques, such as redundant signed digit conversion, are available in order to reduce the sensitivity of the converter to comparison and offset errors. These techniques, particularly one in which two comparison levels are used at each bit decision instead of one, are described by the present inventor in association with others, in IEEE Journal of Solid State Circuits, Volume 27 No. 7, July 1992, pages 957 to 965 inclusive (hereinafter Ginetti et al.). That reference describes both the conventional restoring numerical division principle and the redundant side digit cyclic conversion algorithm and also establishes that the main limiting factor for the accuracy of conversion finally resides in the interstage amplifier, for which the maximum error allowed in the gain is $½^n$ in order to keep the integrated non-linear error to less than half the least significant bit.

When the interstage amplifier is implemented by means of a switched-capacitor integrator, the amplifier has a gain dependent on the ratio of the input and feedback capacitors. The maximum mismatch error allowed is therefore $½^n$ assuming that all other sources of gain error are negligible. If arrays of quite large capacitors are employed, with optimal geometry, satisfactory linearity for 9 or 10-bit conversion has been achieved in a CMOS realisation if thin-oxide capacitor structures are available. Otherwise, 8-bit resolution appears to be the limit for pipelined converters employing a switched-capacitor integrator as the interstage amplifier.

Various cancellation techniques have been described in the literature to overcome this difficulty. Song et al., in IEEE Journal of Solid State Circuits, December 1988, pages 1324 to 1333 describe a capacitor error averaging technique comprising performing two charge transfers at the integrator while exchanging the input and feedback capacitors, an extra integrator being provided to average the two successive outputs to provide a first order cancellation of the mismatch of the capacitors. Each cell of the pipelined analog to digital converter thus comprises two switched-capacitor integrators (requiring two operational amplifiers and eight capacitors) and works within a three-phase clock cycle. The main drawback of this technique is the need for an extra integrator for each stage, so that the power consumption and required area are increased.

Lin et al., in IEEE Journal of Solid State Circuits, pages 628 to 636, April 1991, describe the use of a digitally programmable technique, employing digitally-programmable capacitors to correct their mismatch. However, a large area is required to implement such capacitors with the associated calibrative logic. Moreover, a calibration process must be periodically repeated to compensate for drift in critical conditions, such as temperature, power supply, voltage and the like.

Sutarja et al., in IEEE Journal of Solid State Circuits, December 1988, pages 1316 to 1323 inclusive, describe a technique of refreshing, known as reference refreshing, comprising feeding both the signal to be converted and the reference voltage through the pipeline, so that the gain error in the interstage amplifier does not affect the ratio between the signal to be converted and the reference voltage. To achieve conversion linearity, the offset each cell must be accurately compensated.

The general object of the invention is to provide a pipelined analog-to-digital converter, and particularly an interstage amplifier for such a converter, in which interstage gain error is reduced by at least first order cancellation of capacitor mismatch in a switched-capacitor integrator.

SUMMARY OF THE INVENTION

The present invention is based on the use of two balanced pairs of capacitors which receive respective samples of the output of a preceding stage and two samples of a second, or reference signal, and the transfer of charge from each capacitor of the first pair to a respective capacitor of the second pair and vice versa while the capacitors are receiving the samples of the second or reference signal. This technique enables first order correction of capacitor mismatch, especially if performed in conjunction with redundant signed digit conversion, wherein the said second signal is a signed version of a reference signal. Moreover, an operational amplifier is not needed for the reception of the samples of the said first signal, and accordingly the same operational amplifier may be used on a time shared basis by two adjacent stages of the converter.

The present invention provides in a preferred form an interstage amplifier for a pipelined analog-to-digital converter comprising, in preferred form, an operational amplifier having two balanced amplifying paths; a first pair of capacitors; a second pair of capacitors; and switching means connected to the capacitors and said amplifier and arranged for: (i) during a first phase, enabling the first pair of capacitors to receive a respective first sample of a first signal; (ii) during a second phase, enabling the second pair of capacitors to receive a second sample of the first signal; (iii) during a third phase, enabling the first pair of capacitors to receive a first sample of a second or reference signal and to enable charge to be transferred from each of the first pair of capacitors by way of a respective path of the amplifier to a respective one of the second pair of capacitors; and (iv) during a fourth phase, enabling the second pair of capacitors to receive a second sample of the said second or reference signal and to enable charge to be transferred from each of the second pair of capacitors by way of a respective path of the amplifier to the respective one of the first pair of capacitors.

Preferably the switching means interchanges the input connections and interchanges the output connections of the said paths to compensate for offset in the amplifier.

A pipelined analog-to-digital converter according to the invention has a multiplicity of stages and includes at least one interstage amplifier as aforesaid, said converter including one stage which is connected by said switching means to provide an output signal as said first signal to said amplifier and means for providing a signed reference signal to said amplifier as said second signal.

The converter preferably further comprises a third pair of capacitors and a fourth pair of capacitors, said switching means being arranged during said third and fourth phases to enable the third and fourth pair of capacitors to receive a first and a second sample respectively of an output signal of a second stage adjacent the said one stage of the converter and during said first and second phases to enable the third and fourth pairs of capacitors in a manner corresponding to the enabling of the first and second pairs of capacitors during said third and fourth phases, whereby said operational amplifier constitutes two successive interstage amplifiers for the converter.

The invention also provides a method for interstage amplification in a pipelined analog to digital converter having a multiplicity of stages and at least one interstage amplifier which includes a first pair of capacitors and a second pair of capacitors, the method comprising:

feeding to said first and second pairs of capacitors respective samples of the output of a stage of the converter and respective samples of a reference signal;

transferring charge from each capacitor of said first pair to a respective capacitor of the second pair while the capacitors of said first pair are receiving their respective samples of the reference signal; and transferring charge from each capacitor of said second pair to a respective capacitor of said first pair while the capacitors of said second pair are receiving their respective samples of the reference signal.

The transferring of charge is preferably made by way of respective paths of a differential operational amplifier, the method further comprising interchanging said paths between successive charge transfers.

The said feeding is preferably performed during a first phase in respect of said first pair of capacitors and during a second phase in respect of said second pair of capacitors.

The said transferring of charge from each capacitor of said first pair is preferably performed during a third phase and said transferring of charge from each capacitor of said second pair is performed during a fourth phase.

Further objects and features of the present invention will be apparent from the following description which refers to the accompanying drawings.

BRIEF DESCRIPTION OF THE DRAWINGS

FIG. 1 illustrates a basic cell or stage for a pipelined analog to digital converter.

FIG. 2 illustrates a basic cell or stage for a pipelined analog to digital converter that provides one bit per stage.

FIG. 6 illustrates the amplifier of FIG. 5 coupled to perform as two successive interstage amplifiers.

DESCRIPTION OF PREFERRED EMBODIMENTS

Figure 3:
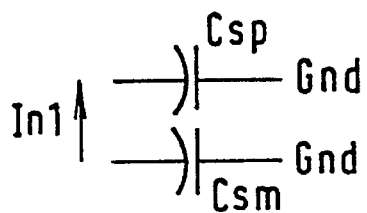
FIG. 3 illustrates a switching scheme for a switched capacitor interstage amplifier according to the invention.
Figure 3:
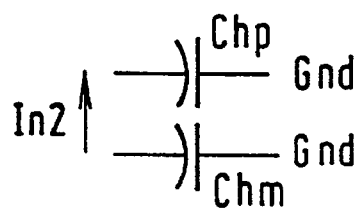
Figure 3:
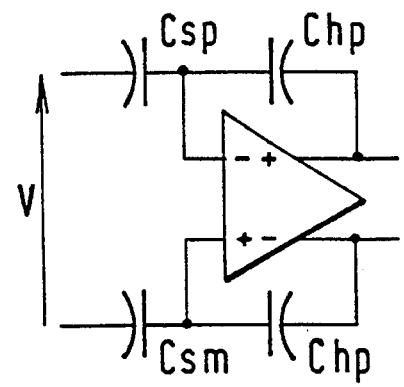
Figure 3:
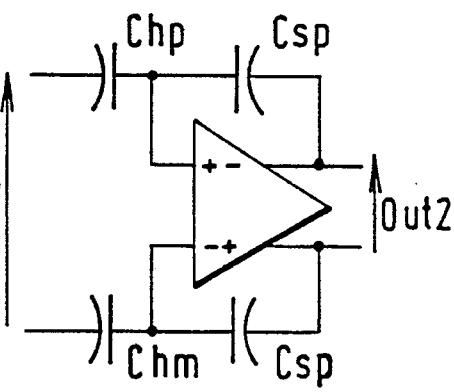

As has been explained in the foregoing, a known technique for convening analog to digital signals to achieve a high data rate without the great power and extensive area of, for example, a flash converter, is to use a pipelined converter. This consists of a plurality of stages in which there is a conversion of the analog signal to digital form progressively, each state providing one or a small number of bits.

In the basic stage shown in FIG. 1, an input line 10, which may be the original input or an input from a preceding and more significant stage, is coupled to the input of a sample and hold circuit 11, of which the output is coupled to an analog to digital converter 12. The analog to digital converter provides a coarse conversion and the relatively small number of bits provided by the converter 12 are output on a bus 13. The n bits output by the stage converter 12 are input to a digital to analog converter 14 and the resulting analog output of this converter is combined with the input signal to the stage in a combiner 15, the output of which provides a residue, corresponding to either the sum of or the difference between the input signal and a signal corresponding to the digital signal input to the converter 14. The residue is multiplied by the same power of 2 as there are bits provided by the stage (n) by an interstage amplifier 16, which provides an output on line 17 to the next most significant stage. As will be seen, it is possible, and preferable, for the amplifier 16 to perform the function of the combiner as well as to provide accurate amplification of the residue.

An important advantage of a pipelined converter is that the stages can work concurrently, by virtue of the sample and hold devices at the input of each stage, so that the data rate of the converter corresponds to the delay of a single stage.

It is generally preferred, though not essential, to set n equal to unity so that each cell or stage provides only a single bit. An important advantage of this choice is that the analog to digital converter 12 as shown in FIG. 1 may be reduced merely to a single comparator (12*a*) which compares the input signal with a reference Vref or, as is preferred, at least two reference levels related to Vref. The comparator 12*a* provides, in this particular example, an output bit of unity if the input signal exceeds the reference and an output bit of zero if the input signal is less than the reference. This bit, as well as being fed to further downstream processing circuits as required, controls the digital-to-analog converter, which reduces to a multiplexer 14*a*. This maybe implemented as a switch 20, controlled by the single bit output of the comparator 12*a*, and arranged to connect the input of the summing device 15 either to the reference voltage Vref as shown by the terminal 21, or to ground, as shown by the terminal 22. Thus in one particularly simple example, the output maybe either 2V−Vref or 2V+Vref, according as the input voltage, twice the output V of the preceding stage, is greater or less than the voltage reference.

Preferably the comparison process employed in each stage is, however, a redundant signed digit (RSD) technique as described for example in Ginetti et al., above cited. In this technique the comparator includes means defining two decision levels, identified herein as P and Q, whereof P is positive and Q is negative. If the input signal from the preceding stage is larger than P, the output code bit is set to +1 and the reference Vref is subtracted from the input signal. If the input signal is smaller than Q, the output bit is set to −1 and the reference is added. Otherwise, the bit is set to 0 and no arithmetical operation is performed. As explained in Ginetti et al., this renders the system much more tolerant of inaccurancy in the comparator, and high levels of noise, offset and even hysteresis may be allowed.

Notwithstanding some additional complexity arising from, for example, more than one threshold level, very few analog components are required in each stage of a pipelined digital to analog converter. However, the circuit is particularly dependent upon the accuracy of the gain in the interstage amplifier; any departure from the nominal value (in this case 2) of the gain results in differential non-linearity.

When implemented by means of a switched-capacitors integrator, the interstage amplifier achieves a gain value depending on the ratio of the input and feedback capacitors. The maximum mismatch error allowed is thus $2^{-n}$, assuming that all other sources of gain error are negligible (i.e. finite gain of the amplifier, charge injected by the MOS switches, etc.). By using rather large capacitor with optimal geometry, 9 or 10-bit linearity has been achieved in CMOS structures providing dedicated capacitor layers (poly-poly or poly-diffusion structures); without these, 8-bit linearity appears to be the limit.

The new technique proposed achieves a first order cancellation of the capacitor mismatch error while performing the functions of the combiner 15 and amplifier 16 in FIG. 2, using a novel switched-capacitor integrator. It makes use of the RSD conversion, where there is no need to accurately restore the voltage residue after each cycle for the next comparison. This feature may be exploited to enable the performance of both the correction of capacitor mismatch and correction of amplifier offset during the sampling phase of the next cell. This avoids the need for the 'averaging integrator' used in the capacitor error averaging technique. Further, the switching scheme has been designed in such a way that each pair of successive cells can share the same amplifier. This brings the total hardware down to only two pairs of capacitor and half an operational amplifier for each stage of conversion. A sample is processed within four clock phases so that the compromise between speed and power is about three times better than with the previous capacitor error averaging technique (i.e. half an operational amplifier and four clock phases rather than two operational amplifiers and three clock phases).

In the new pipelined converter, each sample is represented by two voltages In1 and In2 successively fed to the cascaded 1-bit cells; the way they are processed to generate the corresponding outputs Out1 and Out2 will be described with reference to FIG. 3.

FIG. 3 illustrates the capacitors which receive the input (voltage) samples and the relationships between the capacitors and the operational amplifier which is shared by a pair of successive stages or cells. For the sake of simplicity the switches (such as CMOS switches) which switch the connections of the capacitors have been omitted. It will be obvious from a consideration of Ginetti et al. how the switching means can be arranged to perform the switching illustrated in FIG. 3.

In the first clock phase, a first pair of capacitors Csp and Csm are connected by the switching means to receive in a balanced manner the input signal In1. Thus the right hand 'plates' of the capacitors are connected to a datum (ground) and the left hand plates receive signal In1. In the second clock phase, a second pair of capacitors Chp and Chm receive signal In2 in a similar manner. In the third clock phase, the left hand plates of capacitors Csp and Csm receive signal V whereas the right hand plates are connected to a respective one of the two differential inputs of an operational amplifier and the capacitors Chp and Chm are connected as feedback capacitors for the respective half of the amplifier. In the fourth clock phase, the capacitors Csp and Csm are interchanged with the capacitors Chp and Chm respectively. This switching of the capacitors produces the following effects (i) to (iv).

(i) In clock phase 1, the first input In1, i.e. the first output Out1 of the previous cell, is sampled by the pair of capacitors Csp and Csm.

(ii) In clock phase 2, the second input In2 is sampled by the second pair of capacitors Chp and Chm.

(iii) In clock phase 3, the charges stored on the first pair of capacitors Csp and Csm are transferred to the pair Chp and Chm, so that the first output Out1 corresponds to:

$$\text{Out } 1 = \text{In2} + \alpha(\text{In1} - V)$$

$$\text{with } \alpha = \frac{Csp(Csm + Chm) + Csm(Csp + Chp)}{Chp(Csm + Chm) + Chm(Csp + Chp)}$$

as will be explained with reference to FIG. 4.

In clock phase 4, the whole charges are now transferred to Csp and Csm, so that the amplifier output voltage becomes:

$$Out2 = In1 + (In2 - V)/\alpha$$

The voltage V applied to the pair Csp and Csm and to the pair Chp and Chm during clock phases 3 and 4 respectively depends on the result of the comparison of the out of the preceding stage with the reference levels, according to the redundant signed digit technique described earlier. This comparison procedure yields the following table:

| Signed bit b | Voltage V |
|---|---|
| −1 | −Vref |
| 0 | 0 |
| +1 | +Vref | so that V maybe denoted as 'b. Vref'. The comparison may take place on either clock phase 1 or 2 on the corresponding input, In1 or In2.

There is a delay of two clock phases between odd and even order cells, so that the amplifier which is effectively isolated from the capacitor of one stage by the switching means during clock phases 1 and 2, can be shared with the adjacent cell. Thus the adjacent cell has four capacitors which are separated in the same way, but two clock phases leading (or lagging) so that its capacitors are connected to the amplifier during clock phases 1 and 2 and receive their inputs during clock phases 3 and 4. The input and output connections of the amplifier are swapped on clock phase 4, the positive input being exchanged with the negative input and the positive output being exchanged with the negative output. This exchanging inverts the offset voltage, which is then compensated since the successive outputs are 'averaged', as explained later; this also results in an attenuation of the low frequency noise of the amplifier.

To show the mismatch error compensation process, let us first consider that both the previous and the next cells are ideal, without any mismatch error. The outputs In1 and In2 of the preceding cell are equal, and so:

$$Out1=In1(1+\alpha)-\alpha bVref$$

$$Out2=In1(1+1/\alpha)-1/\alpha bVref$$

Since the next following cell is assumed to be ideal, its inputs are processed identically, so that Out1 and Out2 are averaged. Their mean value Out is given by:

Out =

$$\frac{Out1 + Out2}{2} = 1/2\{In1(2 + 1/\alpha + \alpha) - bVref(\alpha + 1/\alpha)\}$$

provided that α is a value close to unity, and neglecting second order terms, this relation becomes:

$$Out=2In1-bVref$$

which is the ideal transfer function of the 1-bit ADC cell.

In a practical circuit, all cells are affected by a mismatch error which changes from cell to cell; this means that the outputs of each cell are not exactly averaged by the next one, and the complete remaining error term will consist in a complex combination of products of gain errors. Computer simulation appears as the only way to estimate its value, and to predict the linearity that may be achieved with a given capacitor matching. Numerous simulations have been performed with different mismatch values, while considering extreme cases (i.e. all cells affected by an error of common maximal value and sign, and all cells affected by an error of common maximal value but with an opposite sign for the first one). The results showed that the mismatch error is subject to at least first order cancellation. The practical benefit is that when for example the capacitors are matched to about 1% accuracy, which would limit resolution to about seven bits, one can with the present technique obtain satisfactory linearity with a 13-bit resolution.

Figure 4:
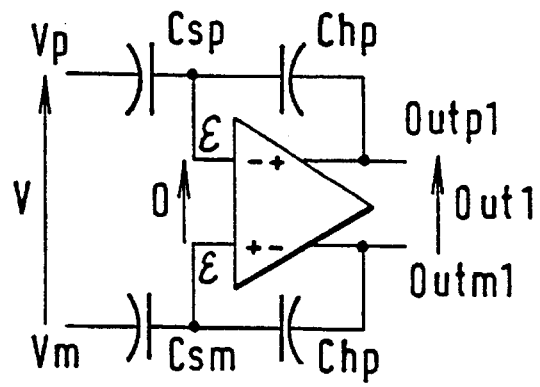
FIG. 4 illustrates in simplified form an interstage amplifier at a particular phase of operation.

Reference may now be made to FIG. 4, which illustrates the derivation of the output signals in FIG. 3. All devices are assumed to be ideal, so that the amplifier has infinite gain, there being no residual voltage between the inputs of the amplifier, and there is no common mode voltage on any of the differential voltages In1, In2, Out1 and V. Accordingly:

$$Inp1=-Inm1=\tfrac{1}{2}In1, Inp2=-Inm2=\tfrac{1}{2}In2, Outp1=-Outm1=\tfrac{1}{2}Out1 \text{ and}$$
$$Vp=-Vm=\tfrac{1}{2}V.$$

Denoting by ε the voltage appearing on both inputs after the first charge transfer (end of clock phase 3), the transfer function of the 1-bit cell is obtained by applying the charge conservation law on amplifier inputs, so that:

$$Csp.Inp1+Chp.Inp2=Csp(Vp-\epsilon)+Chp(Outp1-\epsilon)$$

$$Csm.Inm1+Chm.Inm2=Csm(Vm-\epsilon)+Chm(Outm1-\epsilon)$$

Eliminating ε from this equation system yields:

$$(Csp+Chp)[Chm(Outm1-Into2)-Csm(Inm1-Vm)]=(Csm+Chm)$$
$$[Chp(Outp1-Inp2)-Csp(Inp1-Vp)]$$

Since all common mode voltages are supposed to be null, this is equivalent to:

$$(\tfrac{1}{2}Out1-+e,\text{fra} +ee\ In2)[Chm(Csp+Chp)+Chp(Csm+Chm)]=(\tfrac{1}{2}In1-\tfrac{1}{2}V)[Csm(Csp+Chp)+Csp(Csm+Chm)]$$

and one finally obtains the following transfer function:

Out1 =

$$In2 + (In1 - V)\frac{Csm(Csp + Chp) + Csp(Csm + Chm)}{Chm(Csp + Chp) + Chp(Csm + Chm)}$$

The second output Out2 is obtained by swapping In1 with In2, and Cs with Ch, the roles of the capacitor pairs being interchanged, so that:

Out2 =

$$In1 + (In2 - V)\frac{Chm(Chp + Csp) + Chp(Chm + Csm)}{Csm(Chp + Csp) + Csp(Chm + Csm)}$$

Figure 5:
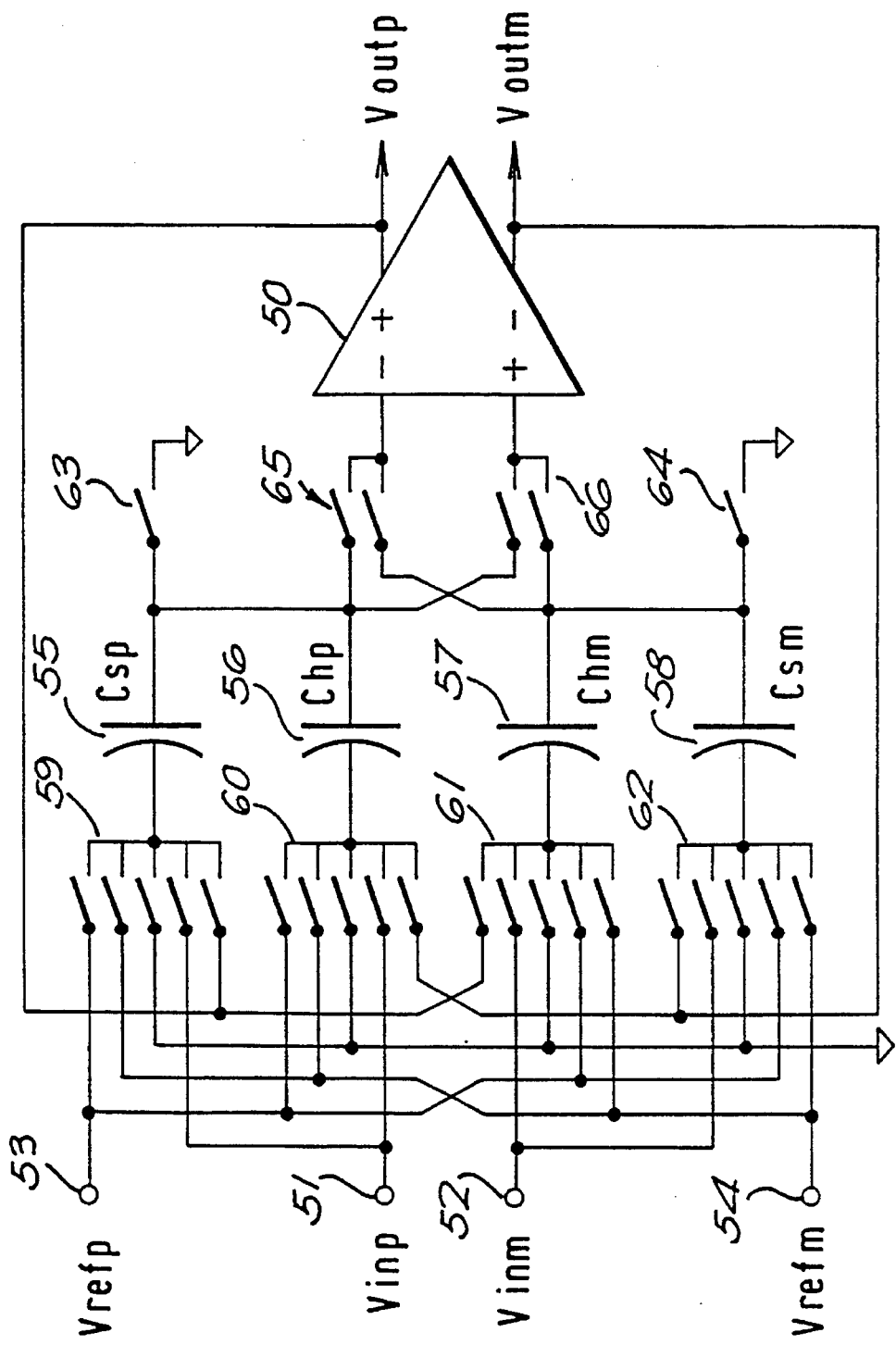
FIG. 5 illustrates a detailed schematic diagram of an interstage amplifier according to the invention.

FIG. 5 is a detailed schematic diagram of an embodiment of the interstage amplifier which has been described with reference to FIGS. 3 and 4. The stage has a single balanced operational amplifier 50 having a first amplifying path extending from a negative input to a positive output and a second amplifying path extending from a positive input to a negative output. Input terminals 51 and 52 receive the input signal and input terminals 53 and 54 receive the reference signal. Capacitors 55–58 correspond to the aforementioned capacitors Csp, Chp, Chm and Csm respectively. Sets of switches 59, 60, 61, 62 connected to the left-hand plates of the capacitors 55–58 provide for the selection of the voltage samples and the connection of the capacitors as required to the outputs of the operational amplifier 50, switch 63 connects capacitors 55 and 56 selectively to ground, switch 64 connects capacitors 57 and 58 selectively to ground and switches 65 and 66 connect the right-hand plates of the capacitors to an appropriate input of the amplifier 50, as previously described.

Figure 6:
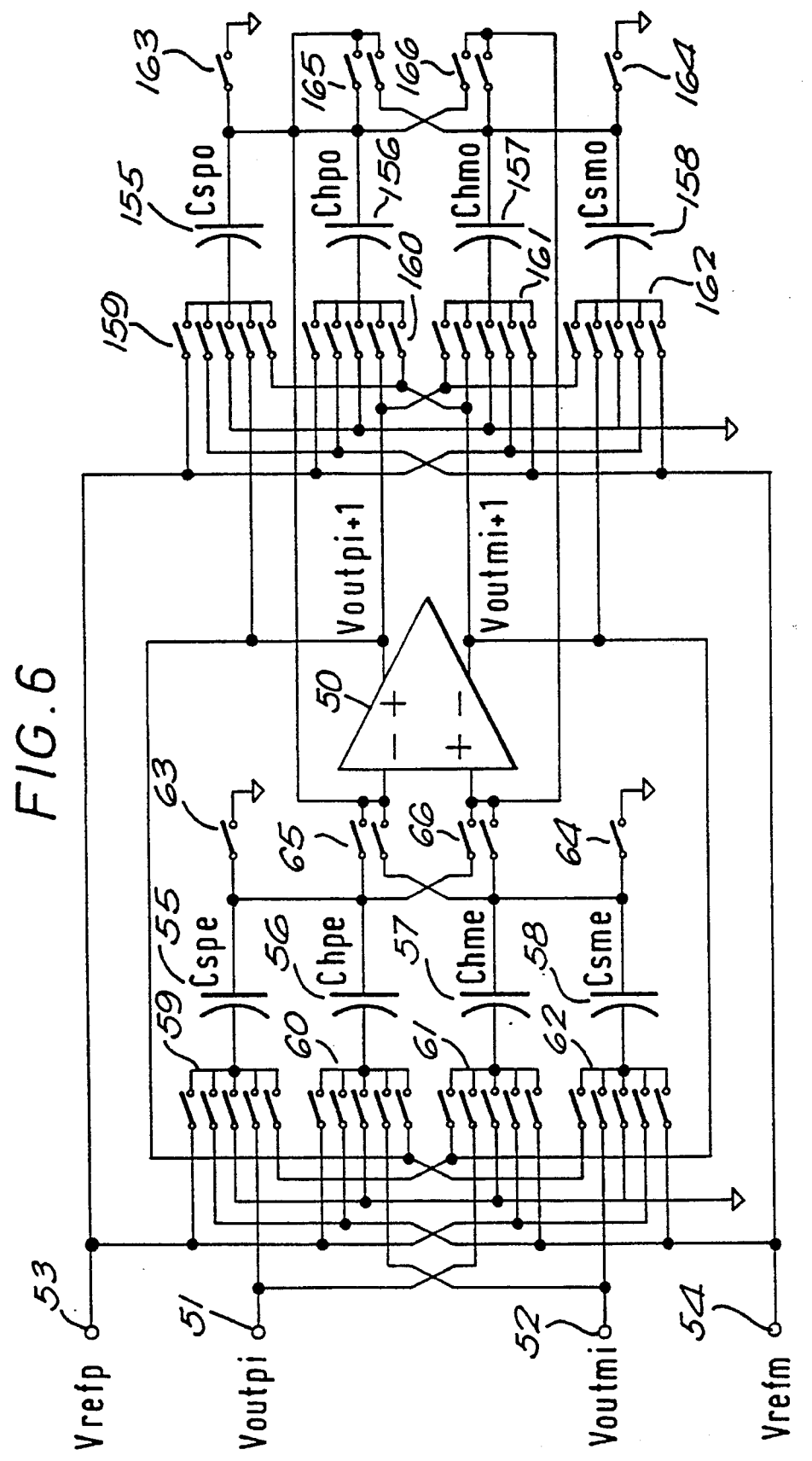

FIG. 6 illustrates the operational amplifier 50 as already described with reference to FIG. 5 and, to the left of the amplifier 50, the switching network comprising switches 59 to 66 which enable the amplifier to provide interstage amplification employing the first pair of capacitors 55 and 58 and the second pair of capacitors 56 and 57. As has been explained previously, the correction of the capacitors' mismatch and the amplifier's offset in respect of one stage can be performed during the sampling phase of the next stage. The amplifier 50 has a second set of capacitors 155–158 and a second switching network composed of switches 159 to 166 disposed similarly to switches 59 to 66 respectively but operable with a two-phase shift relative to switches 59 to 66; thus switches 159 are operated during clock phase 3 similarly to switches 59 during clock phase 1 and so on, by means of clock signals from an appropriate clock pulse source (not shown).

During the previously described 'third' phase the second switching network enables a third pair of capacitors 155 and 158 to receive a respective sample of an output of a stage next to the stage of which the output samples are received by the first pair of capacitors 55 and 58 during the first clock phase. During the 'fourth' phase the second switching network enables a fourth pair of capacitors 156 and 157 each to receive a respective sample of the adjacent stage's output. During the 'first' clock phase the second switching network enables the third pair of capacitors to receive samples of a reference signal and to enable charge to be transferred from each of the third pair of capacitors 155 and 158 to the respective one of the fourth pair of capacitors 156 and 157 byway of the respective path through the amplifier. During the 'second' clock phase the second switching network enables the fourth pair of capacitors 156 and 157 to receive a second sample of the reference signal and enables the transfer of charge from each of the fourth pair of capacitors by way of a respective path of the amplifier to the respective one of the third pair of the capacitors. Thus the switch sets 159 and 165 operate in similar but anti-phase manner to the corresponding switches 59 and 66, so that samples of the reference signal (Vrefp-Vrefm) and the output of the second of two adjacent stages, represented by Voutpi+1 and Voutmi+1, are coupled to their destinations in the same way as the samples of the reference signal and the output of the first of two adjacent stages, represented by Voutpi and Voutmi, are coupled to their respective destinations. For ease of understanding, the first to fourth pairs of capacitors in FIG. 5 are also labelled Cspe,Csme; Chpe,Chme; Cspo, Csmo; and Chpo,Chmo respectively.

Thus there has been described an interstage amplifier and a pipelined analog-to-digital converter which exhibit a significant improvement of a power/speed compromise and a large decrease in the number of components employed.

I claim:

1. An interstage amplifier for a pipelined analog to digital converter, comprising an operational amplifier (50) having balanced amplifying paths; a first pair of capacitors (55,58); a second pair of capacitors (56,57); and switching (59–66) means connected to the capacitors and said amplifier and for:

(i) during a first phase, enabling said first pair of capacitors to receive a respective first sample of a first signal;

(ii) during a second phase, enabling said second pair of capacitors to receive a second sample of the first signal;

(iii) during a third phase, enabling said first pair of capacitors to receive a first sample of a second or reference signal and to enable charge to be transferred from each of said first pair of capacitors by way of a respective path of the amplifier to a respective one of said second pair of capacitors; and (iv) during a fourth phase, enabling said second pair of capacitors to receive a second sample of said second or reference signal and to enable charge to be transferred from each of said second pair of capacitors by way of a respective path of the amplifier to the respective one of said first pair of capacitors.

2. An interstage amplifier according to claim 1, wherein the switching means (59–66) is arranged for interchanging inputs for said paths and interchanging outputs from said paths during said fourth phase.

3. A pipelined analog-to-digital converter having a multiplicity of stages and including at least one interstage amplifier according to claim 1 or 2, said converter including one stage which is connected by said switching means to provide an output signal as said first signal to said amplifier and means for providing a signed reference signal to said amplifier as said second signal.

4. A pipelined analog-to-digital converter according to claim 3, and further comprising: a third pair of capacitors (155,158); a fourth pair of capacitors (156,157) and switching means (159–166) for enabling during said third and fourth phases said third and fourth pair of capacitors to receive a first and a second sample respectively of an output signal of a second stage adjacent said one stage of the converter and for enabling during said first and second phases said third and fourth pairs of capacitors to receive samples of a reference signal and to transfer charge between corresponding capacitors of said third and fourth pairs thereof in a manner corresponding to the enabling of said first and second pairs of capacitors during said third and fourth phases, whereby said operational amplifier constitutes two successive interstage amplifiers for the converter.

5. A method for interstage amplification in a pipelined analog to digital converter having a multiplicity of stages and at least one interstage amplifier which includes a first pair of capacitors (55,58) and a second pair of capacitors (56,57), the method comprising:

feeding to said first and second pairs of capacitors respective samples of the output of a stage of the converter and respective samples of a reference signal;

transferring charge from each capacitor of said first pair to a respective capacitor of the second pair while the capacitors of said first pair are receiving their respective samples of the reference signal; and transferring charge from each capacitor of said second pair to a respective capacitor of said first pair while the capacitors of said second pair are receiving their respective samples of the reference signal.

6. A method according to claim 5 wherein said transferring of charge is made by way of respective paths of a differential operational amplifier, the method further comprising interchanging said paths between successive charge transfers.

7. A method according to claim 5 wherein said feeding is performed during a first phase in respect of said first pair of capacitors and during a second phase in respect of said second pair of capacitors.

8. A method according to claim 7 wherein said transferring of charge from each capacitor of said first pair is performed during a third phase and said transferring of charge from each capacitor of said second pair is performed during a fourth phase.

* * * * *